(12) United States Patent
Hidaka et al.

(10) Patent No.: US 11,050,266 B2
(45) Date of Patent: Jun. 29, 2021

(54) BATTERY MANAGEMENT SYSTEM

(71) Applicant: Samsung SDI Co., Ltd., Yongin-si (KR)

(72) Inventors: Takao Hidaka, Yongin-si (KR); Hwa-Su Kim, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 100 days.

(21) Appl. No.: 16/286,025

(22) Filed: Feb. 26, 2019

(65) Prior Publication Data

US 2019/0267815 A1    Aug. 29, 2019

(30) Foreign Application Priority Data

Feb. 27, 2018    (KR) ........................ 10-2018-0023444

(51) Int. Cl.
*H02J 7/00* (2006.01)
*G01R 31/3842* (2019.01)
(Continued)

(52) U.S. Cl.
CPC ........ *H02J 7/0016* (2013.01); *G01R 31/3842* (2019.01); *H01M 10/482* (2013.01); *H01M 10/486* (2013.01); *H01M 2010/4271* (2013.01)

(58) Field of Classification Search
CPC ...... H02J 7/0016; H02J 7/0021; H02J 7/0045; H01M 2010/4271; H01M 10/486; H01M 10/482; H01M 10/48; G01R 31/3842; G01R 31/36; G08B 21/00; G06F 19/00; Y02E 60/10
(Continued)

(56) References Cited

U.S. PATENT DOCUMENTS

2010/0277123 A1    11/2010    Lim et al.
2012/0175953 A1*    7/2012    Ohkawa .................. B60L 58/14
                                                                      307/18
(Continued)

FOREIGN PATENT DOCUMENTS

JP          2005-348457 A     12/2005
JP              5683710 B2      3/2015
KR    10-2009-0073811 A      7/2009

*Primary Examiner* — Melissa J Koval
*Assistant Examiner* — Trung Q Nguyen
(74) *Attorney, Agent, or Firm* — Lewis Roca Rothgerber Christie LLP

(57) ABSTRACT

A battery management system includes a plurality of balancing resistors that are respectively connected to a plurality of cells that are connected in series to each other, and that respectively form a part of a balancing discharge path of each of the cells, a plurality of balancing switches configured to respectively control a flow of balancing current of the balancing discharge path, a voltage detection circuit configured to detect a voltage of opposite ends of a respective balancing resistor with respect to a balancing target cell among the cells when cell balancing is started, and a balancing control circuit configured to acquire a voltage cumulative value corresponding to a cumulative value of balancing discharge current of the balancing target cell using the voltage of the opposite ends of the respective balancing resistor, and configured to determine whether cell balancing on the balancing target cell is terminated based on the voltage cumulative value.

16 Claims, 12 Drawing Sheets

(51) Int. Cl.
*H01M 10/48* (2006.01)
*H01M 10/42* (2006.01)

(58) Field of Classification Search
USPC ... 324/425–435, 500, 750.3, 757.04, 762.03,
324/600, 663, 671, 200, 207.13, 207.22,
324/239, 241, 515, 520, 530, 76.11,
324/105–124
See application file for complete search history.

(56) References Cited

U.S. PATENT DOCUMENTS

| | | | |
|---|---|---|---|
| 2013/0278218 A1* | 10/2013 | Onnerud | H02J 7/0016 320/118 |
| 2014/0042972 A1* | 2/2014 | Kim | H02J 7/0016 320/118 |
| 2014/0225622 A1 | 8/2014 | Kudo et al. | |

* cited by examiner

BATTERY MANAGEMENT SYSTEM

CROSS-REFERENCE TO RELATED APPLICATION

This application claims priority to, and the benefit of, Korean Patent Application No. 10-2018-0023444 filed in the Korean Intellectual Property Office on Feb. 27, 2018, the entire contents of which are incorporated herein by reference.

BACKGROUND

1. Field

Embodiments disclosed herein relate to a battery management system for cell balancing.

2. Description of the Related Art

Recently, as environmental regulation such as $CO_2$ emission regulation is reinforced, interest in environmentally-friendly vehicles has increased. Accordingly, automobile companies have actively conducted research on a pure electric vehicle or a hydrogen vehicle, as well as a hybrid vehicle or a plug-in hybrid vehicle, and have actively developed products as a result.

An environmentally-friendly vehicle employs a high voltage battery for storing electrical energy obtained from various energy sources. The high voltage battery includes a plurality of cells that are connected in series or in parallel to each other to provide electrical energy of a high voltage. The high voltage battery includes a battery management system (BMS) installed therein for continuously or regularly detecting a voltage, temperature, charge current, discharge current, and the like of each cell to protect the battery should the battery operate abnormally. A cell-balancing function for monitoring a state of each cell to compensate for a deviation between cells is one of useful functions of a BMS.

To effectively use a battery, it is useful to standardize the characteristics of cells included in the battery. However, a characteristic deviation between cells occurs due to a deviation during manufacture of a battery, an environmental difference during use, and the like. When charging and discharging are repeated in a state in which a deviation between cells occurs, cell voltages are different when a battery is fully charged or is completely discharged. Accordingly, stress applied to each cell is changed to cause a difference in the progress of degradation, and to influence on battery lifespan. Particularly, degradation in the characteristic of an entire battery may be accelerated due to a cell with the poorest characteristic.

Accordingly, to extend the lifespan of the entire battery, it may be useful to have an operation of standardizing the characteristics of cells included in the battery via cell balancing.

The above information disclosed in this Background section is only for enhancement of understanding of the background of the invention and therefore it may contain information that does not form the prior art that is already known in this country to a person of ordinary skill in the art.

SUMMARY

The present disclosure provides a cell-balancing method for improving accuracy during calculation of a discharge amount used for cell balancing, and a battery management system for performing the method.

According to an embodiment of the present disclosure, a battery management system includes a plurality of balancing resistors that are respectively connected to a plurality of cells that are connected in series to each other, and that respectively form a part of a balancing discharge path of each of the cells, a plurality of balancing switches configured to respectively control a flow of balancing current of the balancing discharge path, a voltage detection circuit configured to detect a voltage of opposite ends of a respective balancing resistor with respect to a balancing target cell among the cells when cell balancing is started, and a balancing control circuit configured to acquire a voltage cumulative value corresponding to a cumulative value of balancing discharge current of the balancing target cell using the voltage of the opposite ends of the respective balancing resistor, and configured to determine whether cell balancing on the balancing target cell is terminated based on the voltage cumulative value.

The balancing switches, the voltage detection circuit, and the balancing control circuit may be in a battery integrated circuit (IC).

The battery IC may further include a plurality of balancing terminals respectively connected to first electrodes of the cells, wherein the balancing resistors are respectively connected between the first electrodes and the balancing terminals, and wherein the balancing switches are each between a respective pair of neighboring balancing terminals among the balancing terminals.

The battery IC may further include a plurality of input terminals respectively connected to the first electrodes, wherein the voltage detection circuit includes an analog-to-digital converter configured to convert voltages input through first and second inputs thereof into digital data, and configured to output the digital data, a plurality of first switches configured to respectively switch connection between the input terminals and the first input of the analog-to-digital converter, and a plurality of second switches configured to respectively switch connection between the balancing terminals and the second input of the analog-to-digital converter, and wherein, when cell balancing is started, respective ones of the first and second switches are controlled to connect the opposite ends of the corresponding balancing resistor to the balancing target cell.

The balancing control circuit may include an integrator configured to acquire the voltage cumulative value from the digital data when cell balancing is started, a comparator configured to output a result obtained by comparing the voltage cumulative value and a target voltage cumulative value that corresponds to the balancing target cell, and a balancing switch control logic configured to control the balancing switch corresponding to the balancing target cell in response to an output of the comparator, wherein the digital data corresponds to the voltage of the opposite ends of the corresponding balancing resistors.

The battery management system may further include a battery controller configured to calculate a balancing factor of each of the cells from cell state information of each of the cells, and configured to calculate the target voltage cumulative value from the balancing factor.

The battery IC may further include a plurality of input terminals respectively connected to the first electrodes, wherein the voltage detection circuit includes an analog-to-digital converter configured to convert voltages input through first and second inputs into digital data, and configured to output the digital data, a plurality of first switches configured to respectively switch connection between the input terminals and the first input of the analog-to-digital converter, and a plurality of second switches configured to respectively switch connection between the input terminals and the second input of the analog-to-digital converter, and wherein the first and second switches are controlled to sequentially connect the first electrodes and second electrodes of each of the cells to the first and second inputs of the analog-to-digital converter during cell voltage detection with respect to the cells.

The battery management system may further include a plurality of filter resistors respectively connected between the first electrode of the cells and the input terminals.

The battery IC may further include a cell voltage register configured to store the digital data as a cell voltage of each of the cells during cell voltage detection on the cells.

The voltage detection circuit may further include a plurality of third switches configured to respectively switch connection between the balancing terminals and the first input of the analog-to-digital converter, and a plurality of fourth switches configured to respectively switch connection between the balancing terminals and the second input of the analog-to-digital converter, wherein the third switches and the fourth switches are controlled to sequentially connect the first and second electrodes of each of the cells to the first and second inputs of the analog-to-digital converter, instead of the first and second switches, during cell voltage detection on the cells.

The cells may include a plurality of odd numbered cells, and a plurality of even numbered cells, wherein the battery IC further includes a plurality of first balancing terminals connected to first electrodes of the odd numbered cells, respectively, a plurality of second balancing terminals connected to second electrodes of the even numbered cell, respectively, and a plurality of common terminals connected to second electrodes of the odd numbered cells, respectively, wherein the balancing resistors include a plurality of first balancing resistors that are respectively connected between the first electrodes of the odd numbered cells and a plurality of first balancing terminals, and a plurality of second balancing resistors that are respectively connected between the second electrodes of the even numbered cells and a plurality of second balancing terminals, and wherein the balancing switch includes a plurality of first balancing switches that are respectively connected between the first balancing terminals and the common terminals, and a plurality of second balancing switches that are respectively connected between the second balancing terminals and the common terminals.

The battery IC may further include a plurality of first input terminals respectively connected to the first electrodes of the odd numbered cells, and a plurality of second input terminals respectively connected to the second electrodes of the even numbered cells, wherein the voltage detection circuit includes an analog-to-digital converter configured to convert voltages input through first and second inputs thereof into digital data, and to output the digital data, a plurality of first switches configured to respectively switch connections between the first input terminals and the first input of the analog-to-digital converter, a plurality of second switches configured to respectively switch connections between the input terminals and the second input of the analog-to-digital converter, a plurality of third switches configured to respectively switch connections between the first balancing terminals and the second input of the analog-to-digital converter, and a plurality of fourth switches configured to respectively switch connections between the second balancing terminals and the first input of the analog-to-digital converter, wherein the first switches and the third switches are controlled to connect the opposite ends of the first balancing resistors to the first and second inputs of the analog-to-digital converter when cell balancing is started, and wherein the second switches and the fourth switches are controlled to connect the opposite ends of the second balancing resistors to the first and second inputs of the analog-to-digital converter when cell balancing is started.

The balancing control circuit may include an integrator configured to acquire the voltage cumulative value from the digital data when cell balancing is started, a comparator configured to output a result obtained by comparing the voltage cumulative value, and a target voltage cumulative value corresponding to the balancing target cell, and a balancing switch control logic configured to control the balancing switch corresponding to the balancing target cell in response to an output of the comparator, wherein a voltage value output from the analog-to-digital converter during cell balancing corresponds to the voltage of the opposite ends of the corresponding balancing resistors.

The battery management system may further include a battery controller configured to calculate a balancing factor of each of the cells from cell state information of each of the cells, and to calculate the target voltage cumulative value from the balancing factor.

The battery IC may further include a plurality of input terminals respectively connected to the first electrodes of the cells, wherein the voltage detection circuit includes an analog-to-digital converter configured to convert voltages input through first and second inputs into digital data, and to output the digital data, a plurality of first switches configured to respectively switch connections between the input terminals and the first input of the analog-to-digital converter, and a plurality of second switches configured to respectively switch connections between the input terminals and the second input of the analog-to-digital converter, and wherein the first switches and the second switches are controlled to sequentially connect the first and second electrodes of the cells to the first and second inputs of the analog-to-digital converter during cell voltage detection with respect to the cells.

The battery management system may further include a plurality of filter resistors respectively connected between the first electrodes of the cells and the input terminals.

According to embodiment, a discharge amount used for cell balancing may be accurately calculated, and accuracy of determination of whether balancing is completed may be improved using the discharge amount.

DETAILED DESCRIPTION

Figure 1:
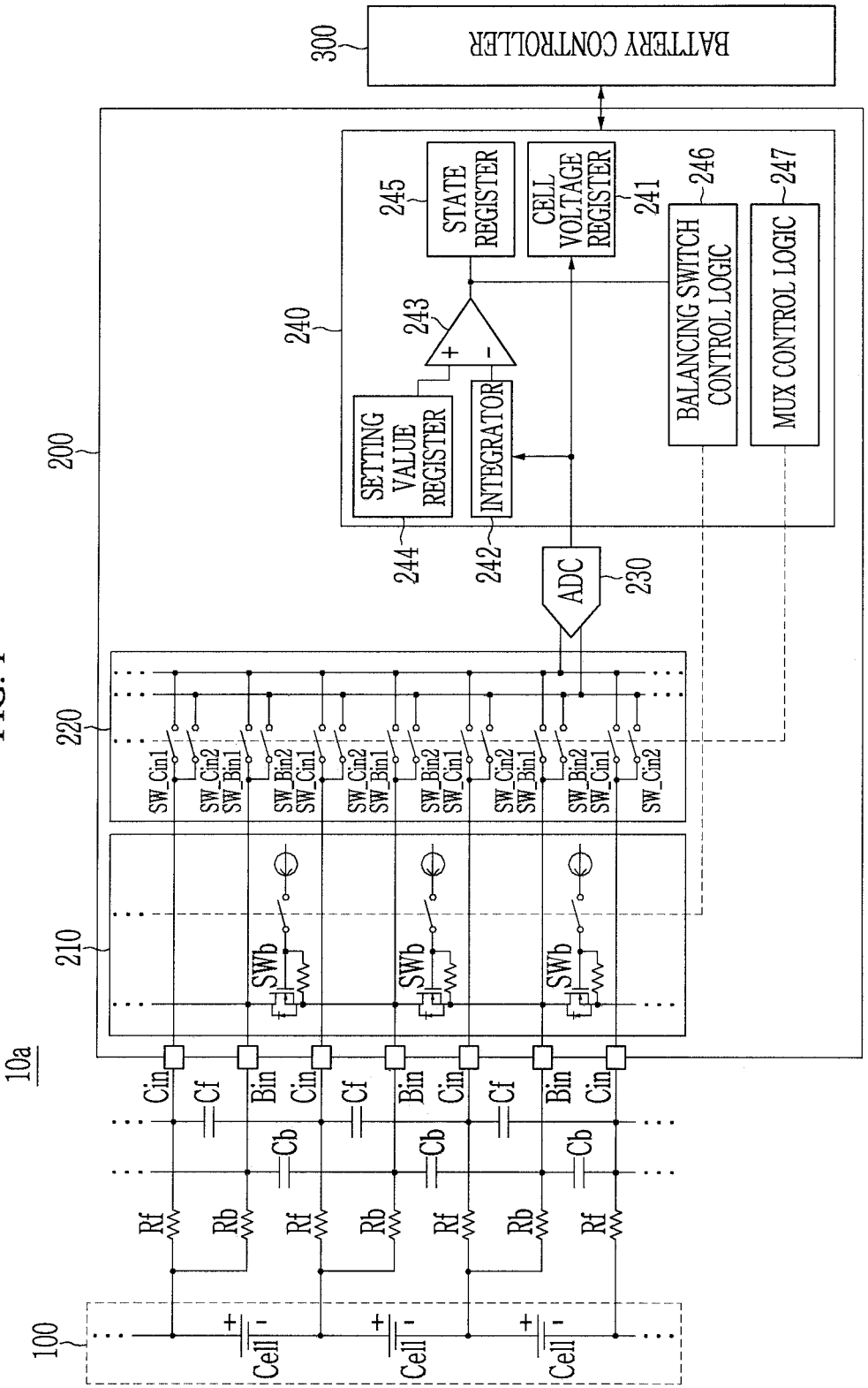
FIG. 1 is a schematic diagram of a battery pack according to a first embodiment of the present disclosure.

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
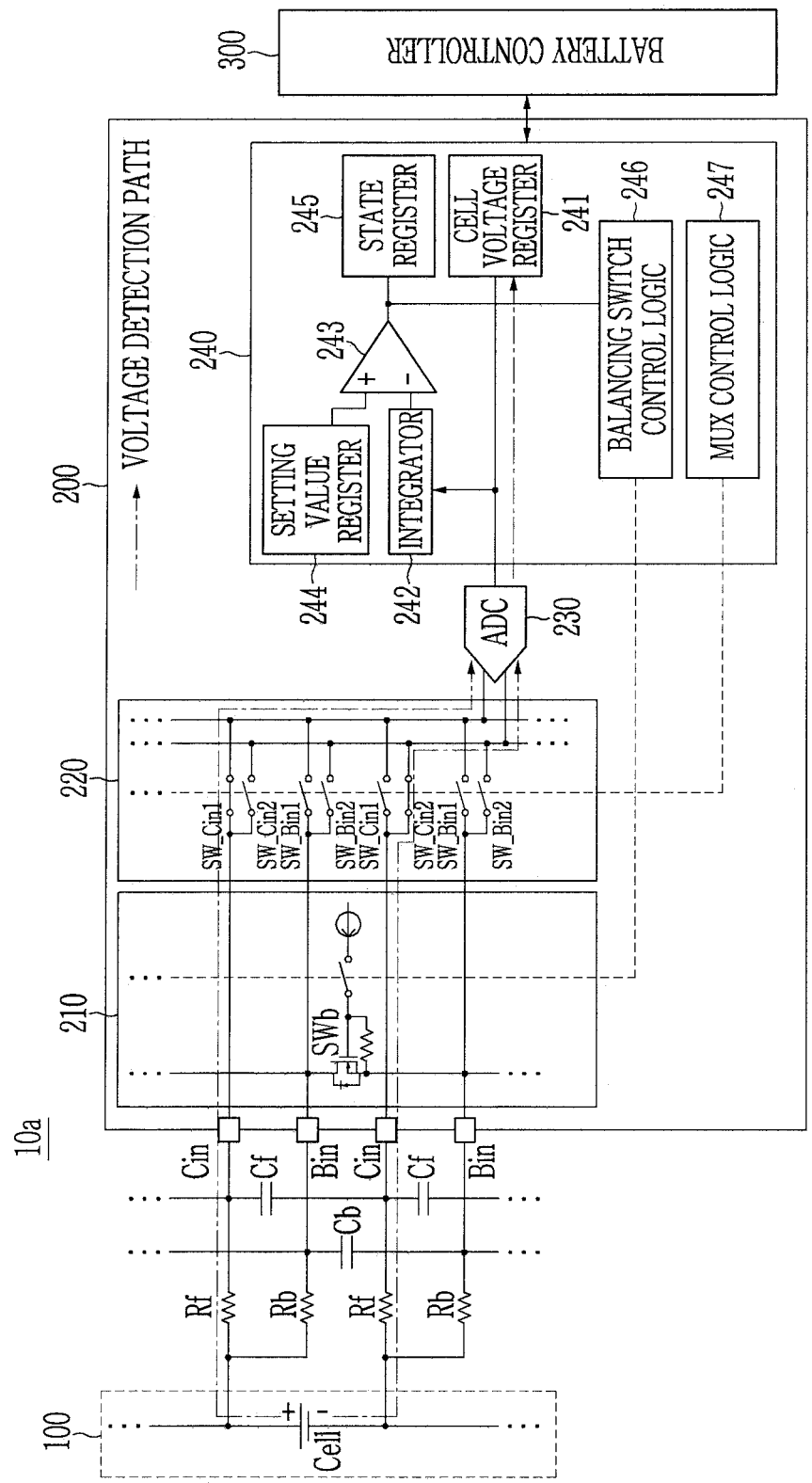
FIG. 2 is a diagram for explanation of a method of measuring a cell voltage in the battery pack of FIG. 1.
Figure 3:
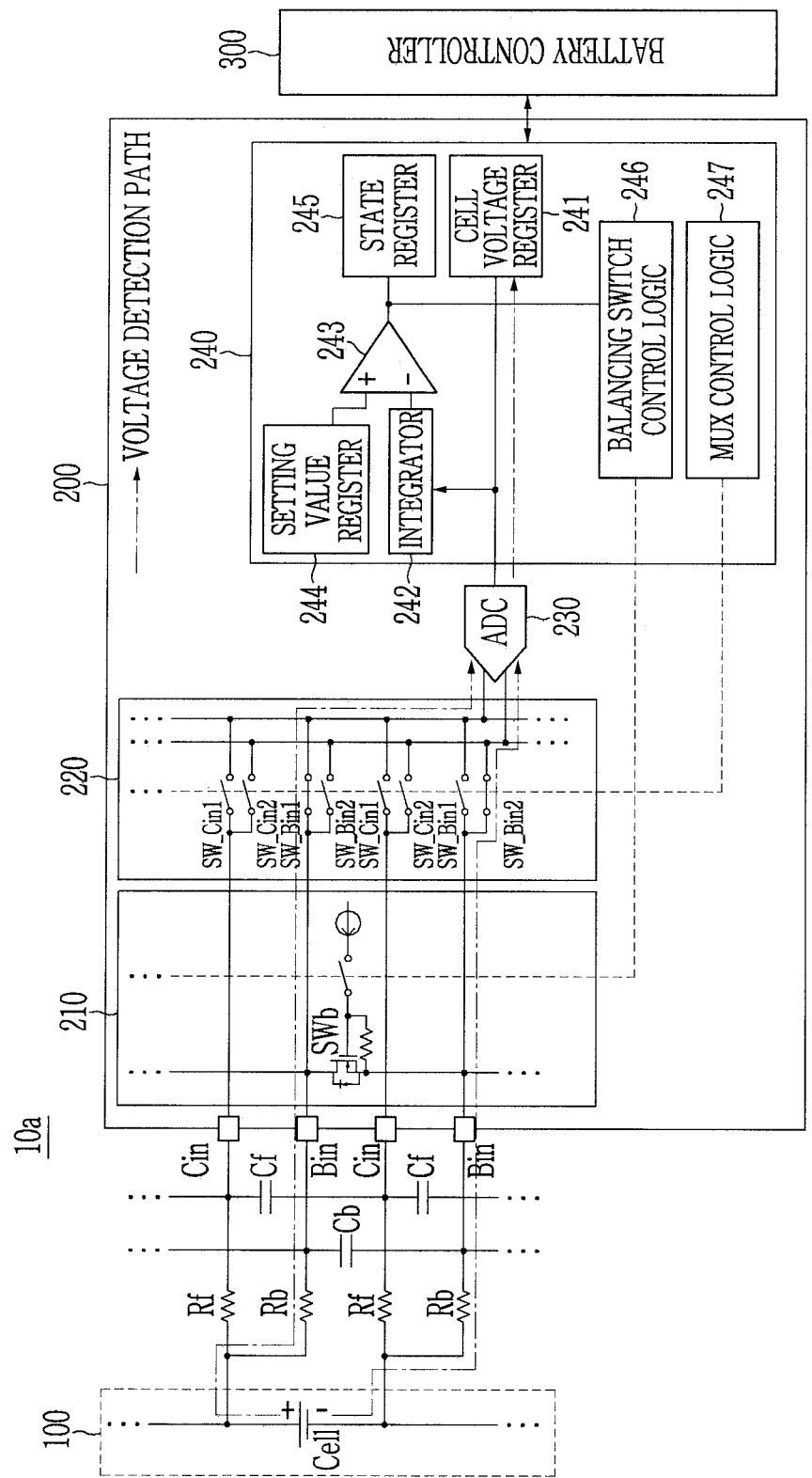
FIG. 3 is a diagram for explanation of a method of measuring a cell voltage using a balancing terminal in the battery pack of FIG. 1.
Figure 4:
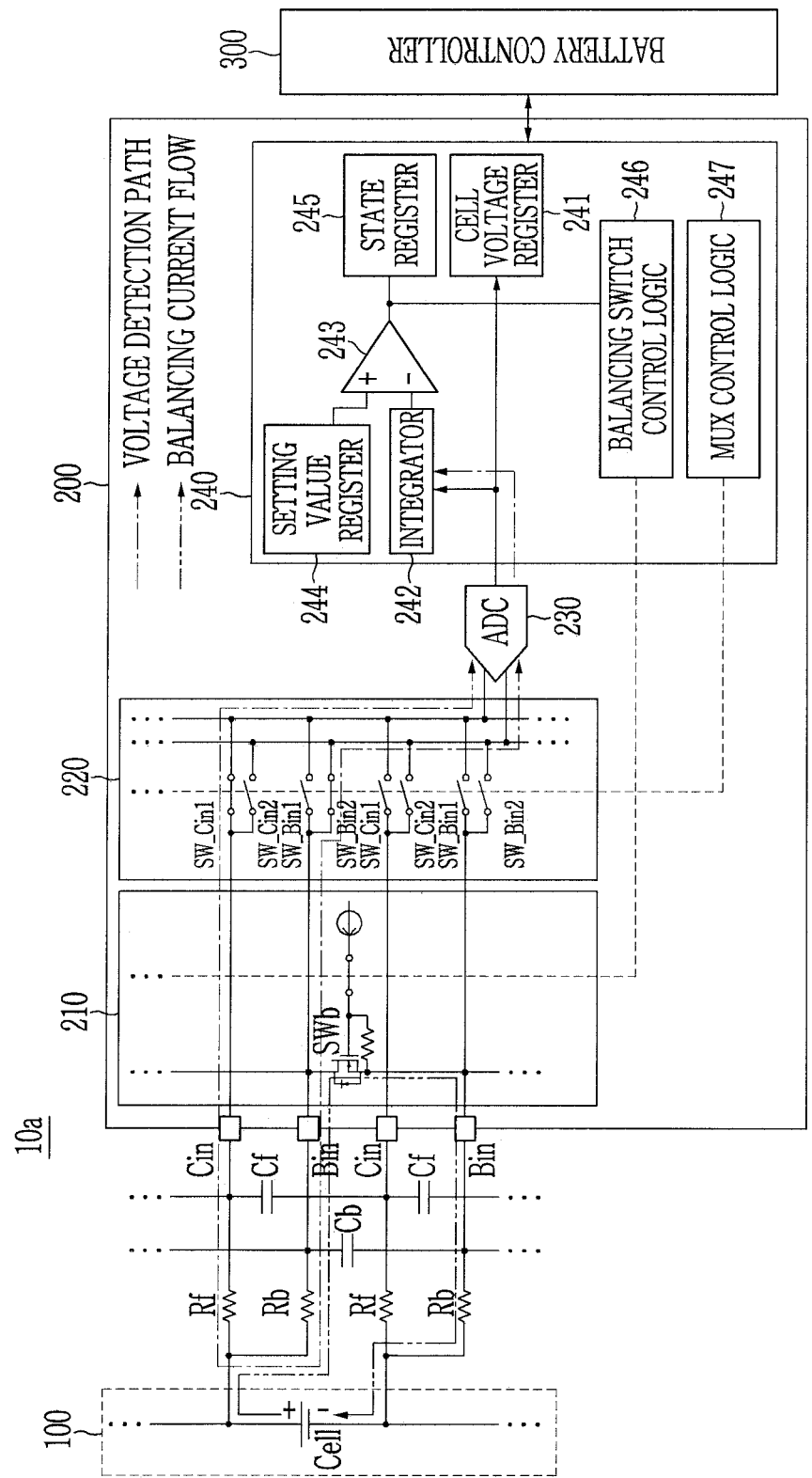
FIGS. 4 and 5 are diagrams for explanation of a method of measuring balancing current in the battery pack of FIG. 1.
Figure 5:
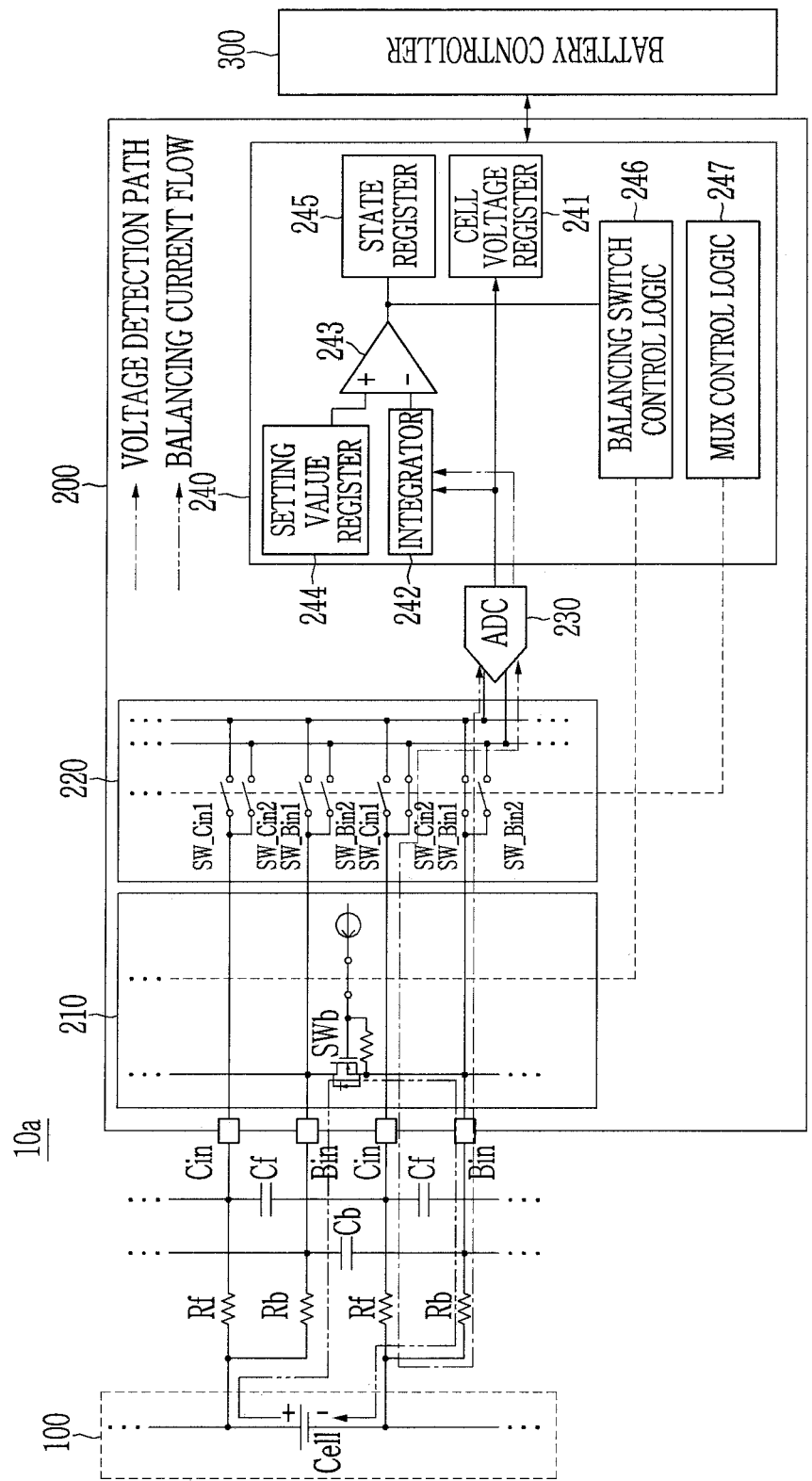
Figure 6:
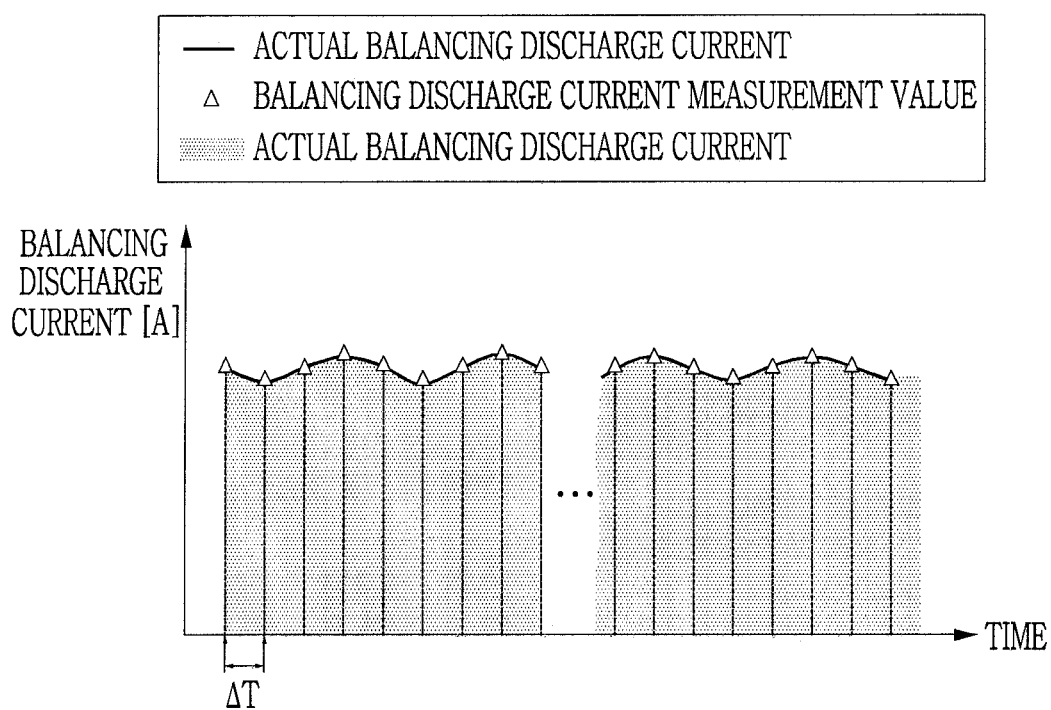
FIG. 6 is a diagram for explanation of a method of accumulating balancing discharge capacity in a battery pack according to the first embodiment of the present disclosure.

FIG. 1 is a schematic diagram of a battery pack according to a first embodiment of the present disclosure. FIG. 2 is a diagram for explanation of a method of measuring a cell voltage in the battery pack of FIG. 1. FIG. 3 is a diagram for explanation of a method of measuring a cell voltage using a balancing terminal in the battery pack of FIG. 1. FIGS. 4 and 5 are diagrams for explanation of a method of measuring balancing current in the battery pack of FIG. 1. FIG. 6 is a diagram for explanation of a method of accumulating balancing discharge capacity in a battery pack according to the first embodiment of the present disclosure.

Referring to FIG. 1, a battery pack 10a according to the first embodiment of the present disclosure may include a battery module 100 and a battery management system (BMS).

The battery module 100 may include a plurality of cells (Cell) that are connected in series to each other.

The battery management system may control an overall operation of the battery pack 10a and, to this end, may include a battery integrated circuit (IC) 200 and a battery controller 300.

The battery IC 200 may detect a cell voltage, charge and discharge current, temperature, and the like of each cell included in the battery module 100, and may control cell balancing of the battery module 100. The battery IC 200 may include an analog front end (AFE) IC, a cell voltage monitoring (CVM) IC, and the like of a battery.

The battery IC 200 may include a plurality of input terminals Cin, a plurality of balancing terminals Bin, a balancing switch circuit 210, a voltage detection circuit, and a balancing control circuit 240.

The plurality of input terminals Cin may be connected to (e.g., respectively) a plurality of cells included in the battery module 100, and may be used as input terminals for detection of a cell voltage. A filter resistor Rf may be connected between each input terminal Cin and a cell corresponding thereto.

In the battery pack 10a of FIG. 1, the input terminal Cin may be shared and used between two neighboring cells. That is, the input terminal Cin connected to a negative electrode of each cell may also be connected to a positive electrode of a neighboring cell by the same filter resistor Rf. Referring to FIG. 2, when a cell voltage of each cell is detected, two input terminals Cin are respectively connected to negative and positive electrodes of a corresponding cell. Further, the input terminal Cin connected to the negative electrode of the corresponding cell may be connected to a positive electrode of a neighboring cell, and may be used when a voltage of the neighboring cell is detected.

Referring back to FIG. 1, the plurality of balancing terminals Bin may be connected to positive electrodes of cells, respectively, and may be used for balancing discharge of a corresponding cell. A balancing resistor Rb may be connected between each balancing terminal Bin and a positive electrode of a corresponding cell, and may form a balancing discharge path of the corresponding cell.

In the battery pack 10a of FIG. 1, the balancing terminal Bin may be shared, and a portion of the balancing discharge path may be shared between two neighboring cells. That is, the balancing terminal Bin connected to a negative electrode of each cell may also be connected to a positive electrode of a neighboring cell by the same balancing resistor Rb. Referring to FIGS. 4 and 5, during balancing discharge of each cell, the two balancing terminals Bin are connected to negative and positive electrodes of a corresponding cell, respectively. Further, the balancing terminal Bin connected to the negative electrode of the corresponding cell may be connected to a positive electrode of a neighboring cell, and may be used during balancing discharge of the neighboring cell. Accordingly, a balancing discharge path of each cell may include the balancing resistor Rb and the balancing terminal Bin that are connected to a positive electrode of the corresponding cell, a corresponding balancing switch SWb, and the balancing resistor Rb and the balancing terminal Bin that are connected to a negative electrode of the corresponding cell (e.g., the balancing resistor Rb and the balancing terminal Bin connected to a positive electrode of a neighboring cell).

The balancing switch circuit 210 may include the balancing switches SWb for controlling a flow of balancing discharge current that flows in the balancing discharge path of each cell, and each balancing switch SWb may be connected between two neighboring balancing terminals Bin. Accordingly, each balancing switch SWb may be connected between opposite ends of a corresponding cell through the two balancing resistors Rb, and may control a flow of balancing current of the corresponding two balancing resistors Rb via an on/off operation. Each balancing switch SWb may be configured with a transistor.

The voltage detection circuit may include a multiplexer 220 and an analog-to-digital converter (ADC) 230 as a switching circuit.

The multiplexer 220 may include two systems of switch circuits SW_Cin and SW_Bin.

The multiplexer 220 may include switches SW_Cin1 and SW_Cin2 for performing switching to input a voltage of opposite ends of each cell as a differential input of the ADC 230. Each switch SW_Cin1 may be connected between the corresponding input terminal Cin and a first input of the ADC 230, and may switch connection between a positive electrode of a corresponding cell and the first input of the ADC 230 (e.g., may be used to selectively connect the positive electrode of the corresponding cell and the first input of the ADC 230). Each switch SW_Cin2 may be connected between the corresponding input terminal Cin and a second input of the ADC 230, and may switch connection between a negative electrode of a corresponding cell and the second input of the ADC 230 (e.g., may be used to selectively connect the negative electrode of the corresponding cell and the second input of the ADC 230).

Each of the switch SW_Cin1 and the switch SW_Cin2 may be controlled by a MUX control logic 247 that will be described below. The switches SW_Cin1 and the switches SW_Cin2 may perform switching to sequentially transmit a voltage of opposite ends of each cell as a differential input (first and second inputs) of the ADC 230 during cell voltage detection. Referring to FIG. 2, the MUX control logic 247 may control the switches SW_Cin1 and SW_Cin2 to connect opposite ends of a cell as a voltage detection target to the differential input of the ADC 230 during cell voltage detection. Accordingly, a voltage of a positive electrode of a cell that is a voltage detection target may be transmitted to the first input of the ADC 230 by the corresponding switch SW_Cin1, a voltage of a negative electrode thereof may be transmitted to the second input of the ADC 230 by the corresponding switch SW_Cin2, and the ADC 230 may convert a voltage difference between the first and second inputs into digital data, and may then output the digital data.

Referring back to FIG. 1, the multiplexer 220 may include switches SW_Bin1 and SW_Bin2 in order to input a voltage of opposite ends of each balancing resistor Rb as the differential input of the ADC 230.

For example, referring to FIG. 4, each switch SW_Bin2, along with a corresponding switch SW_Cin1, may switch connectivity between the opposite ends of the balancing resistor Rb and the first and second inputs of the ADC 230 during cell balancing. In this case, each switch SW_Cin1 may be connected between the corresponding input terminal Cin and the first input of the ADC 230, and may switch connectivity between one end of the corresponding balancing resistor Rb and the first input of the ADC 230. Further, each switch SW_Bin2 may be connected between the corresponding balancing terminal Bin and the second input of the ADC 230, and may switch connectivity between the other end of the corresponding balancing resistor Rb and the second input of the ADC 230.

The MUX control logic 247 may control the switches SW_Cin1 and SW_Bin2 to connect opposite ends of the balancing resistor Rb, which is connected to a positive electrode of a corresponding cell and is included in the balancing discharge path, to the differential input of the ADC 230 in a state in which cell balancing is performed. Accordingly, a voltage of opposite ends of the balancing resistor Rb may be respectively transmitted to the first and second inputs of the ADC 230, and the ADC 230 may convert a voltage difference between the first and second inputs into digital data, and may output the digital data.

For example, referring to FIG. 5, each switch SW_Bin1, along with a corresponding switch SW_Cin2, may switch connection between the opposite ends of the balancing resistor Rb and the first and second inputs of the ADC 230 during cell balancing. In this case, each switch SW_Bin1 may be connected between the corresponding balancing terminal Bin and the first input of the ADC 230, and may switch connection between one end of the corresponding balancing resistor Rb and the first input of the ADC 230. Each switch SW_Cin2 may be connected between the corresponding input terminal Cin and the second input of the ADC 230, and may switch connection between the other end of the corresponding balancing resistor Rb and the second input of the ADC 230.

The MUX control logic 247 may control the switches SW_Bin1 and SW_Cin2 to connect opposite ends of the balancing resistor Rb, which is connected to a negative electrode of a corresponding cell and is included in the balancing discharge path, to the differential input of the ADC 230 in a state in which cell balancing is performed. Accordingly, a voltage of opposite ends of the balancing resistor Rb may be respectively transmitted to the first and second inputs of the ADC 230, and the ADC 230 may convert a voltage difference between the first and second inputs into digital data, and may output the digital data.

In the battery pack 10a of FIG. 1, the balancing discharge path of each cell may include a balancing resistor Rb connected between a positive cell and the corresponding balancing terminal Bin, and another balancing resistor Rb connected between a negative electrode of each cell and the corresponding balancing terminal Bin. The two balancing resistors Rb respectively connected between one of opposite ends of each cell and the corresponding balancing terminals Bin may be connected in series between the opposite ends of each cell (e.g. in the discharge path) to allow balancing discharge current to flow when the corresponding balancing switch SWb is turned on.

In general, the balancing resistors Rb may be designed to have the same resistance. Accordingly, in a first embodiment of the present disclosure, to detect balancing discharge current flowing in the balancing discharge path of each cell, as shown in FIG. 4 or FIG. 5, any one of the two balancing resistors Rb included in each balancing discharge path may be selected to measure a voltage of opposite ends thereof, and when it is not possible to detect a voltage of opposite ends of the selected balancing resistor Rb, a voltage of opposite ends of the other balancing resistor Rb may be measured, and balancing discharge current may be detected.

The switches SW_Bin1 and SW_Bin2 for switching connection between the balancing terminal Bin and the differential input of the ADC 230 may detect fault of the switches SW_Cin1 and SW_Cin2 for cell voltage detection, or may replace the switches SW_Cin1 and SW_Cin2 to be used for cell voltage detection.

Referring to FIG. 3, respective ones of the switches SW_Bin1 and SW_Bin2 for switching connection between the balancing terminal Bin and the differential input of the ADC 230 may perform switching to connect opposite ends of the corresponding cell to the first and second inputs of the ADC 230 in a state in which cell balancing is not performed (e.g., in a state in which the balancing switch SWb is turned off). In this case, each switch SW_Bin1 may be connected between an electrode of a corresponding cell and the first input of the ADC 230 through the balancing resistor Rb, and may switch connection between a positive electrode of a corresponding cell and the first input of the ADC 230. Each switch SW_Bin2 may be connected between an electrode of a corresponding cell and the second input of the ADC 230 through the balancing resistor Rb, and may switch connection between a negative electrode of a corresponding cell and the second input of the ADC 230.

As such, in the battery pack 10a of FIG. 1, the switch SW_Bin1 and the switch SW_Bin2 may transmit a voltage of opposite ends of each cell as a differential input of the ADC 230, and thus, may detect fault of the switch SW_Cin1 and the switch SW_Cin2, or may replace the switch SW_Cin1 and the switch SW_Cin2.

Referring back to FIG. 1, the balancing control circuit 240 may transmit a cell voltage output from the ADC 230 to the battery controller 300, or may determine whether cell balancing is completed based on a voltage of opposite ends of the balancing resistor Rb, based on an output from the ADC 230. To this end, the balancing control circuit 240 may include a cell voltage register 241, an integrator 242, a comparator 243, a setting value register 244, a state register 245, a balancing switch control logic 246, and a MUX control logic 247.

Referring to FIGS. 2 and 3, the digital data output from the ADC 230 may correspond to a voltage of opposite ends of each cell, that is, may correspond to a cell voltage, during cell voltage detection. Accordingly, the cell voltage register 241 may receive the digital data output from the ADC 230, and may store the digital data as a cell voltage of each cell during cell voltage detection.

Referring to FIGS. 4 and 5, the digital data output from the ADC 230 during cell balancing may be a voltage of opposite ends of each balancing resistor Rb. Accordingly, the integrator 242 may receive the digital data output from the ADC 230 during cell balancing, and may accumulate digital data for each balancing resistor Rb to calculate a voltage cumulative value corresponding to each balancing resistor Rb. The voltage cumulative value of each balancing resistor Rb, as integrated by the integrator 242, may be sequentially transmitted to the comparator 243.

Cell voltage detection and detection of a voltage of opposite ends of the balancing resistor Rb may be exclusively performed not to affect each other.

The comparator 243 may compare a voltage cumulative value input from the integrator 242 with a setting value stored in the setting value register 244 with respect to each balancing resistor Rb, and may determine whether cell balancing of a corresponding cell is completed.

Referring to FIGS. 4 and 5, each balancing resistor Rb may have one end connected to a positive electrode (or a negative electrode) of a corresponding cell, and the other end connected to a corresponding balancing terminal Bin. In the balancing resistor Rb, a terminal connected to the positive electrode (or the negative electrode) of the corresponding cell may be connected to the input terminal Cin through the filter resistor Rf. Accordingly, when the MUX 220 is controlled to transmit a voltage between the input terminal Cin and the balancing terminal Bin, which are connected to opposite ends of the balancing resistor Rb, to the differential input of the ADC 230, it may be possible to measure a voltage of opposite ends of a corresponding balancing resistor Rb.

When the balancing switch SWb is turned on for cell balancing, balancing discharge current may flow to the balancing resistors Rb connected to the opposite ends of the corresponding cell. In this case, a voltage across opposite ends of a cell is $V_{cell}$, balancing discharge current flowing between the opposite ends of the corresponding cell is $I_b$, on-resistance of the balancing switch SWb is $R_{on}$, and resistance of each balancing resistor Rb is $R_B$. Accordingly, balancing discharge current $I_b$ of each cell may be calculated according to Equation 1 below.

$$I_b = V_{cell}/(R_{on} R_B \times 2)$$

Referring to Equation 1 above, the balancing discharge current $I_b$ of each cell may be determined by a cell voltage $V_{cell}$ of a corresponding cell, resistance $R_B$ of the balancing resistor Rb, and on-resistance $R_{on}$ of the balancing switch SWb. It may be possible to detect a voltage $R_B \times I_b$ of each balancing resistor Rb by measuring a voltage between the neighboring input terminal Cin and the balancing terminal Bin, as described with reference to FIGS. 4 and 5. Balancing discharge current $I_b$ of each cell may be calculated from a voltage of opposite ends of each balancing resistor Rb according to Equation 2 below.

$$I_b = V_{Rb}/Rb = |V_{Cin} - V_{Bin}|/Rb \quad \text{Equation 2}$$

In Equation 2 above, $V_{an}$ is a voltage measured at the input terminal Cin, and $V_{Bin}$ is a voltage measured at the balancing terminal Bin.

Balancing discharge current $I_b$ of each cell may be affected by the on-resistance $R_{on}$ of the balancing switch SWb. The on-resistance $R_{on}$ of the balancing switch SWb may be changed by environmental conditions such as temperature, which may function as a factor that changes balancing discharge current according to a surrounding environment of battery pack 10a. However, even if a surrounding environment is changed, balancing discharge current is not extremely changed for a short time, and thus, as shown in FIG. 6, a current cumulative value obtained by accumulating the balancing discharge current $I_b$ detected according to Equation 2 above, that is, balancing discharge capacity $\Delta Q_b$, may have a small difference from a cumulative value obtained by accumulating actual balancing current during the same period $\Delta T$.

$$\Delta Q_b = I_b \times \Delta T \quad \text{Equation 3}$$

In Equation 3 above, $\Delta T$ refers to an amount of time to a detection time point of balancing discharge current $I_b$ of a next time from a detection time point of current balancing discharge current $I_b$.

When cell balancing is started, if balancing discharge capacity $\Delta Q_b$ that is periodically calculated using Equation 3 above is accumulated according to Equation 4 above, it may be possible to acquire cumulative balancing discharge capacity $Q_b$ of a corresponding cell.

$$Q_b = \Sigma(Q_b) = \Sigma(I_b \times \Delta T) = \Sigma I_b \times \Delta T \quad \text{Equation 4}$$

When Equation 2 above is applied to Equation 4 above, Equation 5 above may be derived.

$$Q_b = \Sigma I_b \times \Delta T = \Sigma(V_{Rb}/Rb) \times \Delta T = \Sigma(V_{Rb}) \times \Delta T/Rb \quad \text{Equation 5}$$

Equation 5 above may be converted into Equation 6 below.

$$Q_b \times Rb/\Delta T = \Sigma(V_{Rb})$$ Equation 6

Cell balancing of each cell may be performed for the purpose of equalizing cumulative balancing discharge capacity $Q_b$ of each cell and balancing factor $Q_t$, as shown in Equation 7 below.

$$Q_t = Q_b = \Sigma(V_{Rb}) \times \Delta T/Rb$$ Equation 7

Referring to Equation 5 above, when balancing factor Qt of each cell is defined according to Equation 8 below, Equation 9 below may be derived from Equation 6 above.

$$Q_t = \Sigma(V_t) \times \Delta T/Rb$$ Equation 8

$$\Sigma(V_{Rb}) = \Sigma(V_t)$$ Equation 9

Referring to Equation 9 above, a voltage cumulative value $\Sigma(V_{Rb})$, which is obtained by accumulating a voltage of opposite ends of the balancing resistor Rb, and a target voltage cumulative value $\Sigma(V_t)$ may be compared to determine whether balancing of a corresponding cell is completed.

To this end, the battery controller 300 may calculate a setting value $\Sigma(V_t)$ corresponding to balancing factor Qt of each cell according to Equation 8 above, and may store the setting value $\Sigma(V_t)$ in the setting value register 244 in the battery IC 200.

Referring back to FIG. 1, a comparison result in the comparator 243 may be stored in the state register 245, and may be transmitted to the battery controller 300. The battery controller 300 may determine whether cell balancing of each cell is completed based on the comparison result.

The comparison result in the comparator 243 may be transmitted to the balancing switch control logic 246, and the balancing switch control logic 246 may control on/off of each balancing switch SWb based on the comparison result.

The battery controller 300 may acquire state information of each cell included in the battery module 100 through the battery IC 200, and may determine whether cell balancing of each cell is performed based on the state information. Here, the cell state information may include a cell voltage, charge and discharge current, temperature, a state of charge (SOC), and the like of each cell.

Upon determining that cell balancing of the battery module 100 is warranted, the battery controller 300 may calculate a balancing factor of each cell (hereinafter, referred to as "balancing target cell") that may benefit from balancing based on a cell voltage of each other, and may calculate a target voltage cumulative value $\Sigma(V_t)$ from the balancing factor according to Equation 8 above.

Upon calculating the target voltage cumulative value $\Sigma(V_t)$, the battery controller 300 may transmit cell-balancing control information including the target voltage cumulative value $\Sigma(V_t)$ to the battery IC 200, and thus, may make a request for beginning the cell balancing. Here, the cell-balancing control information may include balancing target cell information, the target voltage cumulative value $\Sigma(V_t)$) of each balancing target cell, a cell voltage detection period, and the like.

Although FIG. 1 illustrates an example of the case in which the switches SW_Cin1 and SW_Cin2 for switching between the input terminals Cin and the differential input of the ADC 230, and the switches SW_Bin1 and SW_Bin2 for switching between the balancing terminals Bin and the differential input of the ADC 230, are embodied as one MUX 220, the present disclosure is not limited thereto.

Figure 7:
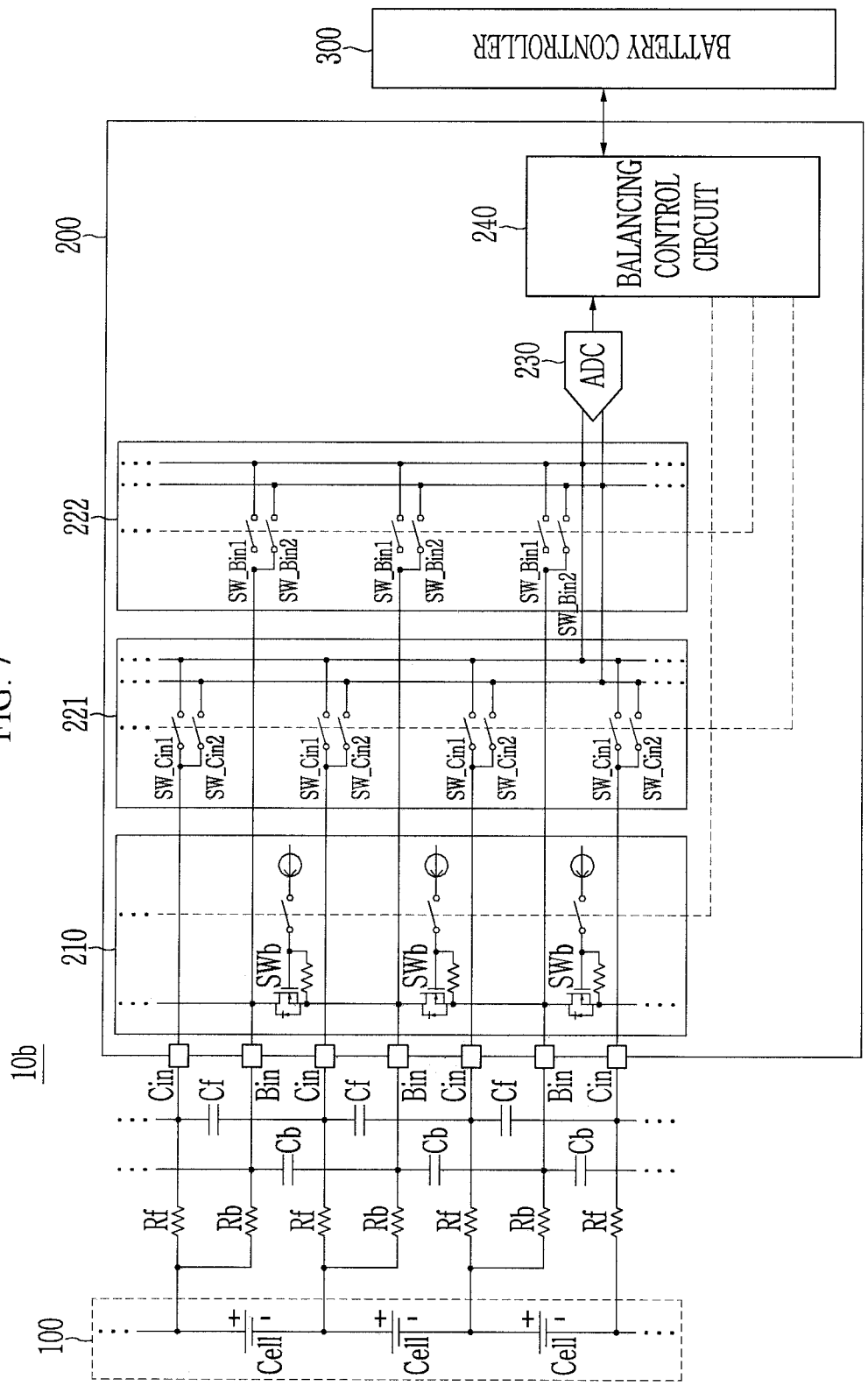
FIG. 7 is a schematic diagram of a battery pack according to a second embodiment of the present disclosure.

For example, FIG. 7 is a schematic diagram of a battery pack according to a second embodiment of the present disclosure, and illustrates an example of an embodiment in which the switches SW_Cin1 and SW_Cin2 for switching between the input terminals Cin and the differential input of the ADC 230, and the switches SW_Bin1 and SW_Bin2 for switching between the balancing terminals Bin and the differential input of the ADC 230, are embodied as different respective MUXes 221 and 222. In the battery pack 10b of FIG. 7, the MUX 221 may provide a main voltage measurement path when a cell voltage is measured, and when the MUX 221 fails, the MUX 222 may replace the MUX 221 to provide a voltage measurement path, thereby ensuring redundancy.

In the battery pack 10a of FIG. 1, each cell may include one balancing terminal Bin, and the balancing switch SWb may be connected between the balancing terminals Bin of neighboring cells. In this structure, when the balancing switches SWb of two or more neighboring cells are simultaneously turned on, a voltage corresponding to two or more cells may be applied between a source and a drain of a transistor of the balancing switch SWb to maintain an off-state by the balancing switch SWb that is positioned outside said balancing switches SWb of the two or more neighboring cells. As the number of neighboring cells that are simultaneously turned on is increased, a voltage applied between a source and a drain may be further increased to maintain an off-state by the balancing switch SWb positioned outside the neighboring cells, and may be increased to an off breakdown voltage or greater of a transistor between the source and the drain.

Accordingly, in the battery pack 10a of FIG. 1, to prevent neighboring cells from being simultaneously turned on, a method of alternately performing cell balancing on an odd numbered cell and an even numbered cell may be used, although balancing efficiency may deteriorate.

To overcome this problem, in the following third embodiment of the present disclosure, one common terminal may be added to every two cells (e.g., respective pairs of neighboring cells) to simultaneously turn on neighboring cells.

Figure 8:
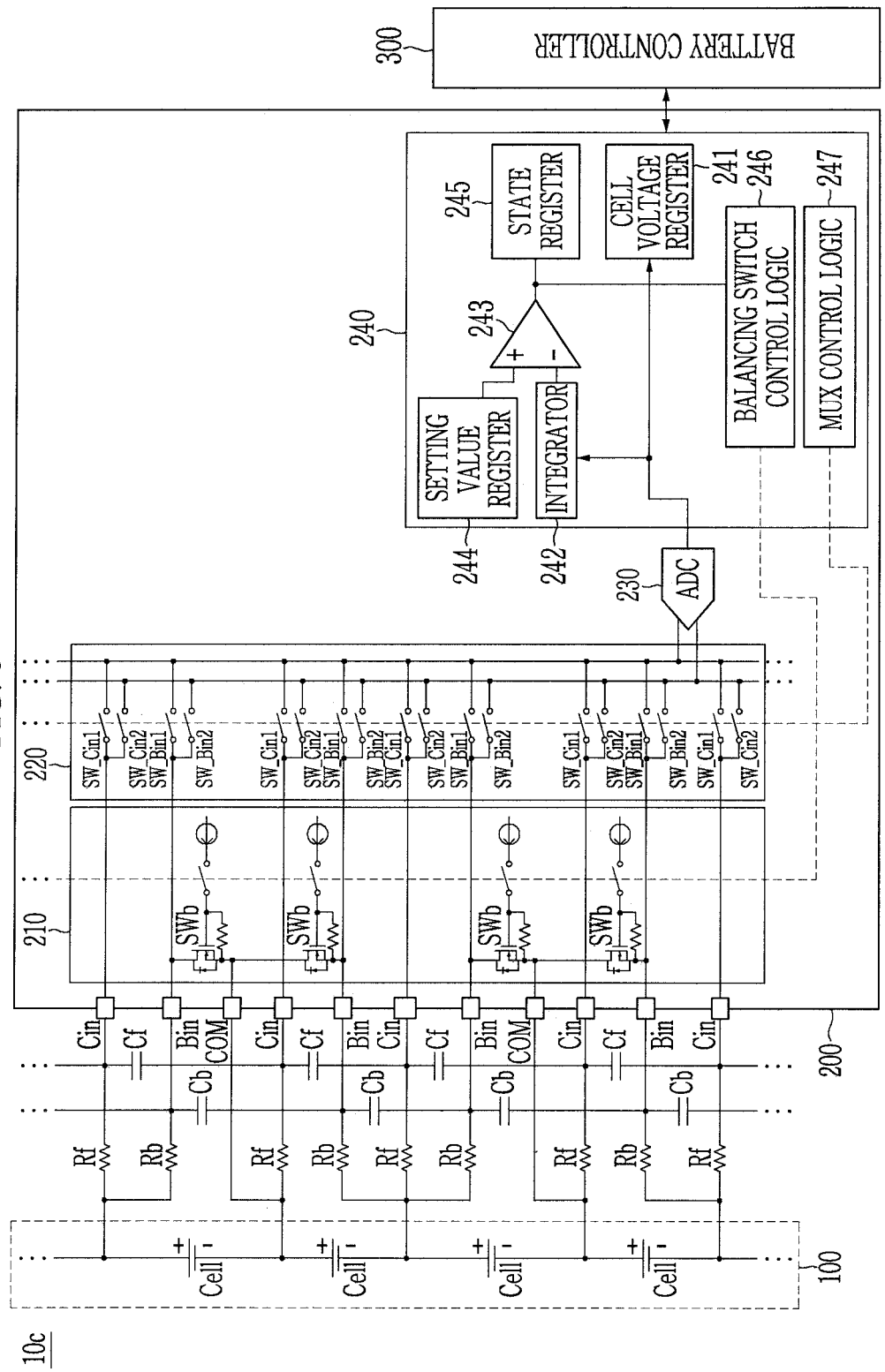
FIG. 8 is a schematic diagram of a battery pack according to a third embodiment of the present disclosure.
Figure 9:
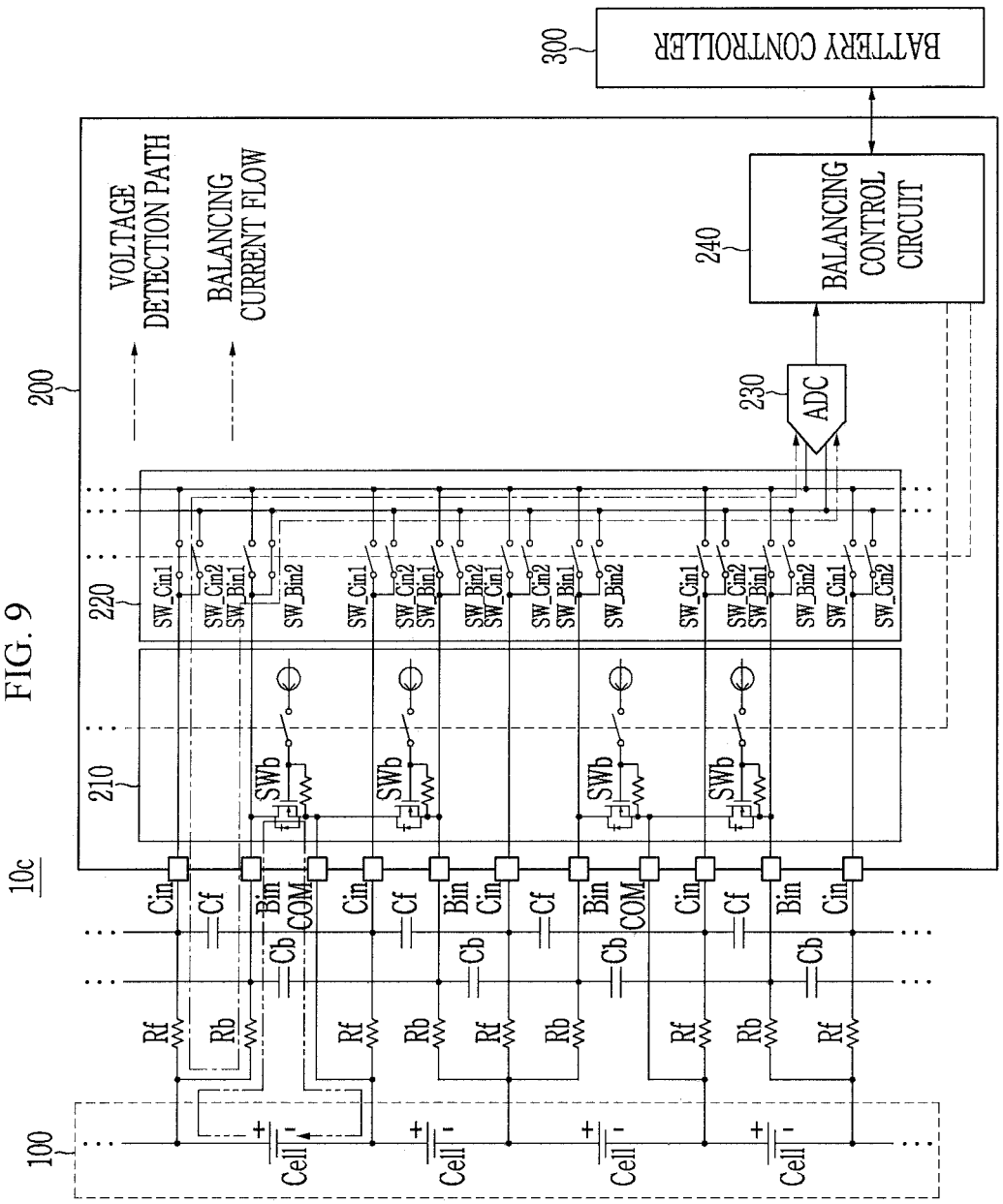
FIGS. 9 to 11 are diagrams for explanation of a method of measuring balancing current in the battery pack of FIG. 8.
Figure 10:
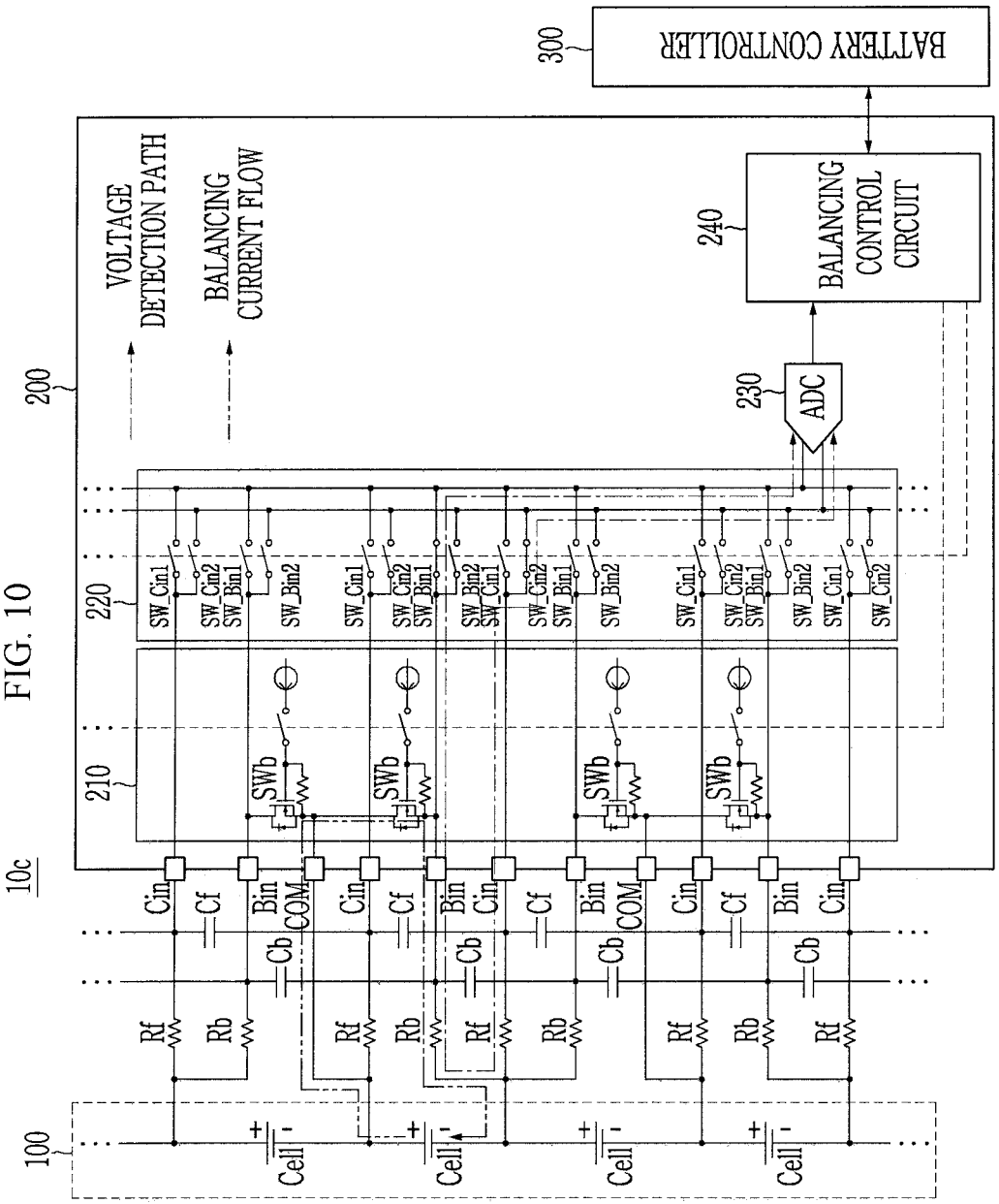
Figure 11:
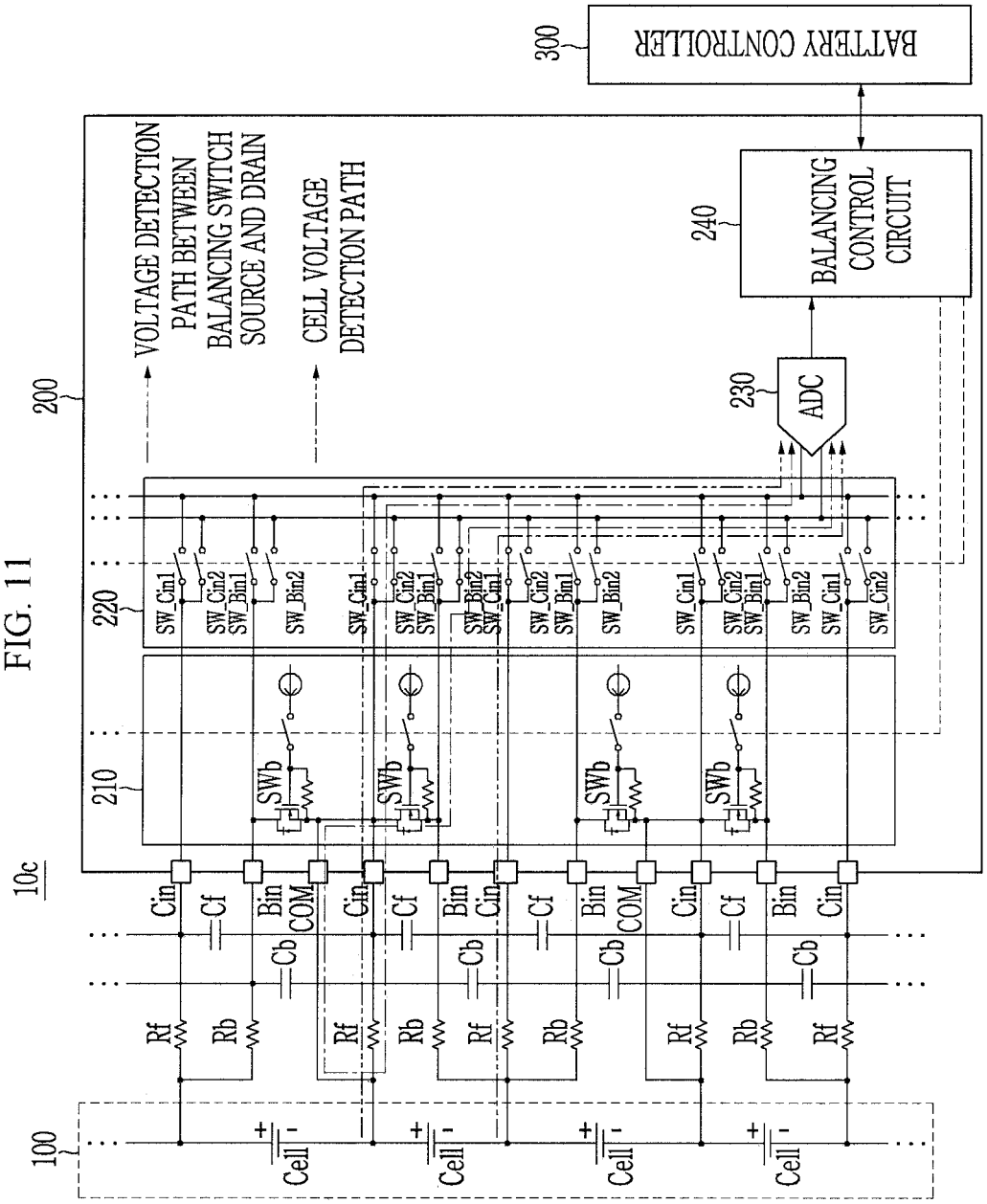

FIG. 8 is a schematic diagram of a battery pack according to a third embodiment of the present disclosure. FIGS. 9 to 11 are diagrams for explanation of a method of measuring balancing current in the battery pack of FIG. 8.

To avoid repetition, a detailed description of the same or similar constituent elements to the battery packs 10a, 10b according to the first embodiment of the present disclosure described with reference to FIGS. 1 and 7 among constituent elements of the battery pack 10c shown in FIG. 8 is omitted.

Referring to FIG. 8, the battery pack 10c according to the third embodiment of the present disclosure may include the battery module 100, the battery IC 200, and the battery controller 300.

The battery IC 200 may include a plurality of input terminals Cin, a plurality of balancing terminals Bin, a plurality of common terminals COM, the balancing switch circuit 210, a voltage detection circuit, and the balancing control circuit 240.

The plurality of input terminals Cin may be respectively connected to a plurality of cells included in the battery module 100, respectively, and may be used as input terminals for cell voltage detection. A filter resistor Rf may be connected between each input terminal Cin and a cell corresponding thereto.

In the battery pack 10c of FIG. 8, the input terminal Cin may be shared and used between two neighboring (adjacent) cells. That is, the input terminal Cin connected to a negative electrode of each cell may also be connected to a positive electrode of a neighboring cell by the same filter resistor Rf.

The plurality of balancing terminals Bin may be connected to a plurality of cells, respectively, and may be used for balancing discharge of a corresponding cell. The balancing resistor Rb may be connected between a respective balancing terminal Bin and a cell corresponding thereto, and may form a balancing discharge path of the corresponding cell.

One of the plurality of common terminals COM may be located for each pair of neighboring cells (e.g., between an odd numbered cell and an even numbered cell), and may be used for balancing discharge of two corresponding cells.

In the battery pack 10c, two neighboring cells that share the common terminal COM may be configured in such a way that the balancing terminals Bin are connected to different electrodes, and that the common terminal COM is a connection node of two cells. Accordingly, as shown in FIG. 9, a balancing discharge path of any one of two neighboring cells that share the common terminal COM may include the balancing resistor Rb and the balancing terminal Bin that are connected to a positive electrode of a corresponding cell, the balancing switch SWb, and the common terminal COM connected to a negative electrode of the corresponding cell.

As shown in FIG. 10, a balancing discharge path of the other cell may include the common terminal COM connected to a positive electrode of the corresponding other cell, the balancing switch SWb, and the balancing terminal Bin and the balancing resistor Rb that are connected to a negative electrode of the corresponding other cell.

Accordingly, a balancing discharge path of each cell may include a single balancing resistor Rb.

The balancing switch circuit 210 may include the balancing switches SWb for controlling a flow of balancing discharge current that flows in the balancing discharge path of each cell, and two neighboring balancing switches SWb may be connected between the balancing terminal Bin and the common terminal COM that correspond to each other.

The multiplexer 220 may include the switches SW_Cin1 and SW_Cin2 for performing switching to input a voltage of opposite ends of each cell as a differential input of the ADC 230. Each switch SW_Cin1 may be connected between a corresponding input terminal Cin and a first input of the ADC 230, and may switch connection between a positive electrode of a corresponding cell and the first input of the ADC 230. Each switch SW_Cin2 may be connected between a corresponding input terminal Cin and a second input of the ADC 230, and may switch connection between a negative electrode of a corresponding cell and the second input of the ADC 230.

The multiplexer 220 may further include the switches SW_Bin1 and SW_Bin2 to input a voltage of opposite ends of a corresponding balancing resistor Rb during balancing of each cell to the differential input of the ADC 230.

For example, referring to FIG. 9, the balancing resistor Rb connected to a positive electrode of a corresponding cell may have opposite ends connected to the first and second inputs of the ADC 230 by the switches SW_Cin1 and SW_Bin2, respectively. In this case, the switch SW_Cin1 may be connected between the corresponding input terminal Cin and the first input of the ADC 230, and may switch connection between one end of the balancing resistor Rb and the first input of the ADC 230. The switch SW_Bin2 may be connected between the corresponding balancing terminal Bin and the second input of the ADC 230, and may switch connection between the other end of the balancing resistor Rb and the second input of the ADC 230.

For example, referring to FIG. 10, the balancing resistor Rb connected to a negative electrode of a corresponding cell may have opposite ends connected to the first and second inputs of the ADC 230 by the switch SW_Bin1 and the switch SW_Cin2, respectively. In this case, the switch SW_Bin1 may be connected between the corresponding balancing terminal Bin and the first input of the ADC 230, and may switch connection between one end of the balancing resistor Rb and the first input of the ADC 230. The switch SW_Cin2 may be connected between the corresponding input terminal Cin and the second input of the ADC 230, and may switch connection between the other end of the balancing resistor Rb and the second input of the ADC 230.

In the third embodiment of the present disclosure, when it is difficult to detect a voltage of opposite ends of the balancing resistor Rb using the method shown in FIGS. 9 and 10, as shown in FIG. 11, a cell voltage of a corresponding cell and a voltage between a drain and a source of the corresponding balancing switch SWb may be measured, and a voltage of opposite ends of the corresponding balancing resistor Rb may also be acquired from a difference between the two voltages.

For example, referring to FIG. 11, the balancing switch SWb may be connected between the balancing terminal Bin of a corresponding cell and the common terminal COM, and the common terminal COM may be connected to a corresponding input terminal Cin through the filter resistor Rf. Accordingly, the voltage between the drain and the source of the balancing switch SWb may be acquired by measuring a voltage between the input terminal Cin connected to the common terminal COM among the input terminals Cin connected to opposite ends of the corresponding cell, and the corresponding balancing terminal Bin.

The switches SW_Cin1, SW_Cin2, SW_Bin1, and SW_Bin2 may be switched to connect the input terminal Cin and the balancing terminal Bin, which are connected to the common terminal COM, of each balancing target cell to the differential input of the ADC 230 during cell balancing.

To detect a voltage of opposite ends of the balancing resistor Rb, an operation of measuring a voltage between a drain and a source of the balancing switch SWb, and an operation of measuring a voltage of opposite ends of the corresponding cell, may be performed.

Figure 12:
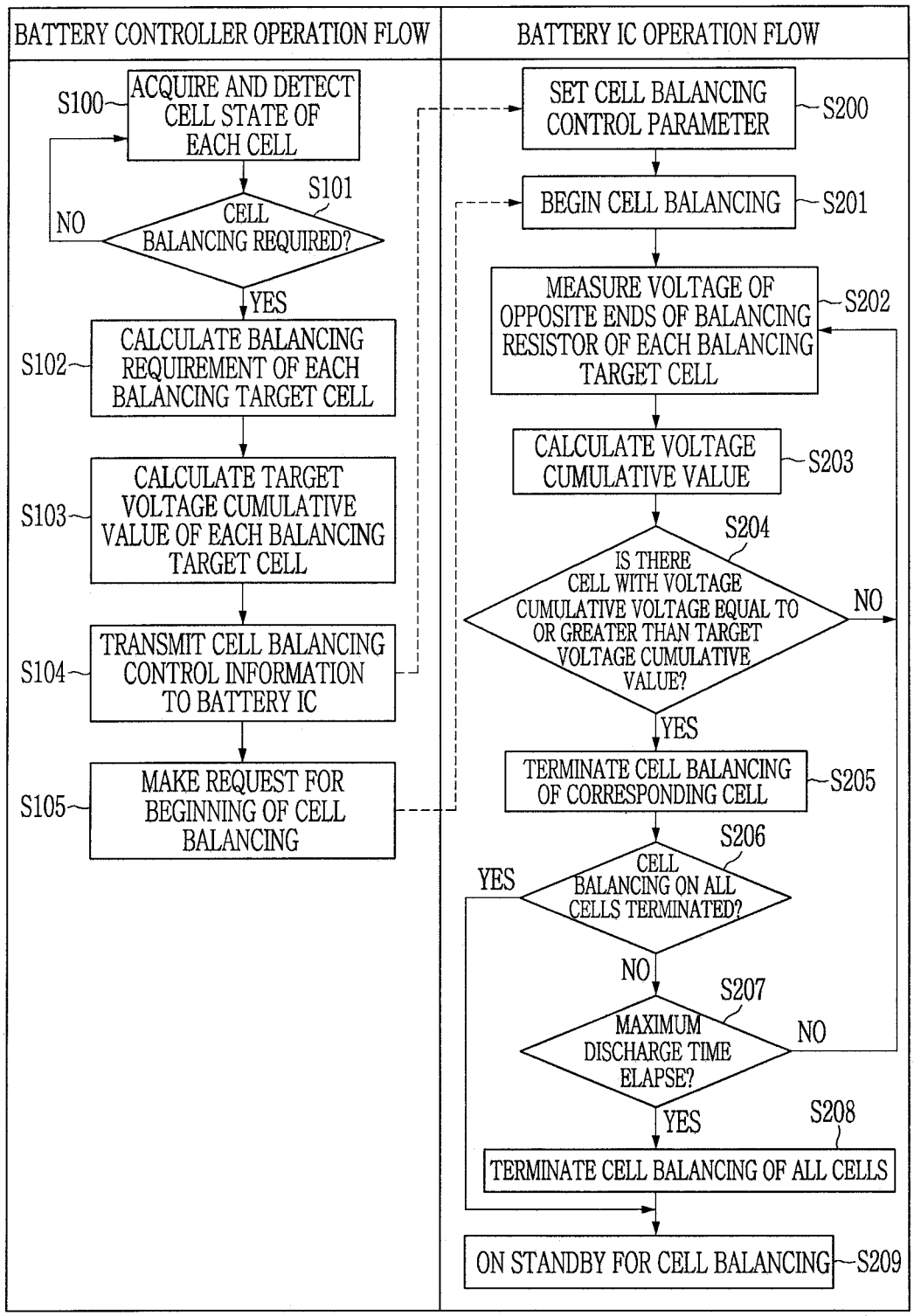
FIG. 12 is a flow chart showing a cell-balancing method in a battery pack according to embodiments of the present disclosure.

FIG. 12 is a flow chart showing a cell-balancing method in a battery pack according to embodiments of the present disclosure. The following cell-balancing method may be performed by the battery packs 10a, 10b, and 10c described with reference to FIGS. 1 to 11.

Referring to FIG. 12, in the battery packs 10a and 10b according to embodiments of the present disclosure, the battery controller 300 may periodically receive a cell state, such as a cell voltage, charge and discharge current, and temperature of each cell included in the battery module 100, from the battery IC 200, and may acquire cell state information from the cell state (S100).

In operation S100, the cell state information may include a cell voltage, a state of charge (SOC), or the like of each cell. Here, the SOC of each cell may be estimated from cell voltage, charge and discharge current, or temperature of each cell.

Upon acquiring state information of each cell included in the battery module 100, the battery controller 300 may determine whether there is a cell that may benefit from cell balancing based on the state information (S101).

Upon determining that cell balancing of the battery module 100 is warranted, the battery controller 300 may calculate each balancing target cell based on cell state information of each balancing target cell (S102). With reference to the aforementioned Equation 8, the target voltage cumulative value $\Sigma(V_t)$ may be calculated from the balancing factor of each balancing target cell (S103).

Upon calculating the target voltage cumulative value $\Sigma(V_t)$, the battery controller 300 may transmit cell-balancing control information including the target voltage cumulative value $\Sigma(V_t)$ to the battery IC 200 (S104) and may make a request for beginning cell balancing to the battery IC 200 (S105).

In operation S104, the cell-balancing control information may include balancing target cell information, the target voltage cumulative value $\Sigma(V_t)$) of each balancing target cell, a voltage detection period, and the like.

The battery IC 200 that receives the cell-balancing control information from the battery controller 300 may set a cell-balancing control parameter based on the cell-balancing control information (S200).

In operation S200, the battery IC 200 may acquire balancing target cell information from the cell-balancing control information, and may set balancing target cell selection information based on the balancing target cell information. The battery IC 200 may acquire the target voltage cumulative value $\Sigma(V_t)$ of each cell from the cell-balancing control information, and may store the target voltage cumulative value $\Sigma(V_t)$ in the setting value register 244. A voltage detection period may be received from the cell-balancing control information, and a period of detecting a voltage of opposite ends of the balancing resistor Rb may be set during cell balancing.

Then, upon receiving a request for beginning cell balancing from the battery controller 300, the battery IC 200 may begin cell balancing based on control parameters (e.g., predetermined control parameters) through operation S200 (S202). Through operation S200, based on the balancing target cell selection information, the balancing switches SWb of a corresponding cell may be turned on to allow balancing current to flow to a balancing discharge path of a balancing target cell.

When cell balancing is started, the battery IC 200 may periodically measure a voltage of opposite ends of the corresponding balancing resistor Rb with respect to each balancing target cell (S202). In addition, the voltage cumulative value $\Sigma(V_{Rb})$ may be calculated based on the measured voltage of the opposite ends of the balancing resistor Rb (S203).

In operation S202, a method of detecting the voltage of opposite ends of the balancing resistor Rb has been described in detail with reference to FIGS. 4, 5, and 9 to 11, and thus, a repeated description thereof will be omitted.

Upon calculating the voltage cumulative value $\Sigma(V_{Rb})$ of the balancing resistor Rb of each balancing target cell, the battery IC 200 may compare the voltage cumulative value $\Sigma(V_{Rb})$ with the target voltage cumulative value $\Sigma(V_t)$ of a corresponding cell (S204).

As a comparison result, when there is a cell with the voltage cumulative value $\Sigma(V_{Rb})$ that is equal to or greater than the target voltage cumulative value $\Sigma(V_t)$, cell balancing on the corresponding cell may be terminated (S205). That is, the balancing switch SWb of the corresponding cell may be turned off.

The battery IC 200 may repeatedly perform operations S202 to S205 until cell balancing on all balancing target cells is terminated (S206), or when a maximum discharge time elapses even though balancing of all balancing target cells is not terminated (S207). Then, cell balancing on the all balancing target cells may be terminated (S208).

When cell balancing on all of the balancing target cells is terminated, the battery IC 200 may be on standby to perform next cell balancing (S209).

As described above, according to embodiments of the present disclosure, without adding a new terminal, it may be possible to measure a voltage of opposite ends of the balancing resistor Rb using the input terminal Cin, to estimate balancing discharge current using the voltage during cell balancing, and to determine whether cell balancing is completed.

In the aforementioned embodiments of the present disclosure, to reduce computational complexity, the case in which the voltage cumulative value $\Sigma(V_{Rb})$ obtained by accumulating a voltage of opposite ends of the balancing resistor Rb, and the target voltage cumulative value $\Sigma(V_t)$ calculated from balancing factor of each balancing target cell by the battery controller 300, are directly compared has been exemplified, but the embodiments of the present disclosure are not limited thereto. According to another embodiment of the present disclosure, the balancing control circuit 240 may calculate the balancing discharge current $I_b$ from the voltage of opposite ends of the balancing resistor Rb with reference to Equation 2 above, and may compare a current cumulative value obtained by accumulating the balancing discharge current $I_b$ with a target current cumulative value to determine whether balancing is completed. In this case, the battery controller 300 may calculate a target current cumulative value from balancing factor Qt of each balancing target cell using a similar method to Equation 5 above.

While this invention has been described in connection with what is presently considered to be practical embodiments, it is to be understood that the invention is not limited to the disclosed embodiments. Thus, it would be obvious to one of ordinary skill in the art that this invention is intended to cover various modifications and equivalent arrangements included within the spirit and scope of the invention. Accordingly, the actual technical scope of the present disclosure is defined by the technical art of the appended claims with functional equivalents thereof to be included herein.

| Description of Some Reference Characters | |
|---|---|
| 10a, 10b, 10c: battery pack | 100: battery module |
| 200: battery IC | 210: balancing switch circuit |
| 220, 221, 222: multiplexer | 230: analog-to-digital converter |
| 240: balancing control circuit | 241: cell voltage register |
| 242: integrator | 243: comparator |
| 244: setting value register | 245: state register |
| 246: balancing switch control logic | 247: MUX control logic |
| SWb: balancing switch | Rb: balancing resistor |
| Rf: filter resistor | Bin: balancing terminal |
| Cin: input terminal | COM: common terminal |

What is claimed is:
1. A battery management system comprising:
a plurality of balancing resistors that are respectively connected to a plurality of cells that are connected in series to each other, and that respectively form a part of a balancing discharge path of each of the cells;
a plurality of balancing switches configured to respectively control a flow of balancing current of the balancing discharge path;
a voltage detection circuit configured to detect a voltage of opposite ends of a respective balancing resistor with respect to a balancing target cell among the cells when cell balancing is started; and a balancing control circuit configured to acquire a voltage cumulative value corresponding to a cumulative value of balancing discharge current of the balancing target cell using the voltage of the opposite ends of the respective balancing resistor, and configured to determine whether cell balancing on the balancing target cell is terminated based on the voltage cumulative value, wherein the voltage detection circuit is respectively connected to the opposite ends of the respective balancing resistor to detect the voltage of the opposite ends of the respective balancing resistor.

2. The battery management system of claim 1, wherein the balancing switches, the voltage detection circuit, and the balancing control circuit are in a battery integrated circuit (IC).

3. The battery management system of claim 2, wherein the battery IC further comprises a plurality of balancing terminals respectively connected to first electrodes of the cells, wherein the balancing resistors are respectively connected between the first electrodes and the balancing terminals, and wherein the balancing switches are each between a respective pair of neighboring balancing terminals among the balancing terminals.

4. The battery management system of claim 3, wherein the battery IC further comprises a plurality of input terminals respectively connected to the first electrodes, wherein the voltage detection circuit comprises:
an analog-to-digital converter configured to convert voltages input through first and second inputs thereof into digital data, and configured to output the digital data;
a plurality of first switches configured to respectively switch connection between the input terminals and the first input of the analog-to-digital converter; and
a plurality of second switches configured to respectively switch connection between the balancing terminals and the second input of the analog-to-digital converter, and wherein, when cell balancing is started, respective ones of the first and second switches are controlled to connect the opposite ends of the respective balancing resistor to the balancing target cell.

5. A battery management system comprising:
a plurality of balancing resistors that are respectively connected to a plurality of cells that are connected in series to each other, and that respectively form a part of a balancing discharge path of each of the cells; and
a battery integrated circuit (IC) comprising:
a plurality of balancing terminals respectively connected to first electrodes of the cells;
a plurality of input terminals respectively connected to the first electrodes;
a plurality of balancing switches configured to respectively control a flow of balancing current of the balancing discharge path, each of the balancing switches being between a respective pair of neighboring ones of the balancing terminals;
a voltage detection circuit configured to detect a voltage of opposite ends of a respective balancing resistor with respect to a balancing target cell among the cells when cell balancing is started, the voltage detection circuit comprising:
an analog-to-digital converter configured to convert voltages input through a first input and a second input thereof into digital data, and configured to output the digital data;
a plurality of first switches configured to respectively switch connection between the input terminals and the first input of the analog-to-digital converter; and
a plurality of second switches configured to respectively switch connection between the balancing terminals and the second input of the analog-to-digital converter; and
a balancing control circuit configured to acquire a voltage cumulative value corresponding to a cumulative value of balancing discharge current of the balancing target cell using the voltage of the opposite ends of the respective balancing resistor, and configured to determine whether cell balancing on the balancing target cell is terminated based on the voltage cumulative value, the balancing control circuit comprising:
an integrator configured to acquire the voltage cumulative value from the digital data when cell balancing is started;
a comparator configured to output a result obtained by comparing the voltage cumulative value and a target voltage cumulative value that corresponds to the balancing target cell; and
a balancing switch control logic configured to control the balancing switch corresponding to the balancing target cell in response to an output of the comparator, wherein the balancing resistors are respectively connected between the first electrodes and the balancing terminals, wherein, when cell balancing is started, respective ones of the first and second switches are controlled to connect opposite ends of the respective balancing resistor to the balancing target cell, and wherein the digital data corresponds to the voltage of the opposite ends of the respective balancing resistor.

6. The battery management system of claim 5, further comprising a battery controller configured to calculate a balancing factor of each of the cells from cell state information of each of the cells, and configured to calculate the target voltage cumulative value from the balancing factor.

7. The battery management system of claim 3, wherein the battery IC further comprises a plurality of input terminals respectively connected to the first electrodes, wherein the voltage detection circuit comprises:
an analog-to-digital converter configured to convert voltages input through a first input and a second input thereof into digital data, and configured to output the digital data;
a plurality of first switches configured to respectively switch connection between the input terminals and the first input of the analog-to-digital converter; and
a plurality of second switches configured to respectively switch connection between the input terminals and the second input of the analog-to-digital converter, and wherein the first and second switches are controlled to sequentially connect the first electrodes and second electrodes of each of the cells to the first and second inputs of the analog-to-digital converter during cell voltage detection with respect to the cells.

8. The battery management system of claim 7, further comprising a plurality of filter resistors respectively connected between the first electrode of the cells and the input terminals.

9. The battery management system of claim 7, wherein the battery IC further comprises a cell voltage register configured to store the digital data as a cell voltage of each of the cells during cell voltage detection on the cells.

10. The battery management system of claim 7, wherein the voltage detection circuit further comprises:
a plurality of third switches configured to respectively switch connection between the balancing terminals and the first input of the analog-to-digital converter; and
a plurality of fourth switches configured to respectively switch connection between the balancing terminals and the second input of the analog-to-digital converter, and
wherein the third switches and the fourth switches are controlled to sequentially connect the first and second electrodes of each of the cells to the first and second inputs of the analog-to-digital converter, instead of the first and second switches, during cell voltage detection on the cells.

11. A battery management system comprising:
a plurality of balancing resistors that are respectively connected to a plurality of cells that are connected in series to each other, and that respectively form a part of a balancing discharge path of each of the cells, the cells comprising a plurality of odd numbered cells, and a plurality of even numbered cells; and
a battery integrated circuit (IC) comprising:
a plurality of balancing switches configured to respectively control a flow of balancing current of the balancing discharge path;
a voltage detection circuit configured to detect a voltage of opposite ends of a respective balancing resistor with respect to a balancing target cell among the cells when cell balancing is started;
a balancing control circuit configured to acquire a voltage cumulative value corresponding to a cumulative value of balancing discharge current of the balancing target cell using the voltage of the opposite ends of the respective balancing resistor, and configured to determine whether cell balancing on the balancing target cell is terminated based on the voltage cumulative value;
a plurality of first balancing terminals connected to first electrodes of the odd numbered cells, respectively;
a plurality of second balancing terminals connected to second electrodes of the even numbered cell, respectively; and
a plurality of common terminals connected to second electrodes of the odd numbered cells, respectively,
wherein the balancing resistors comprise a plurality of first balancing resistors that are respectively connected between the first electrodes of the odd numbered cells and a plurality of first balancing terminals, and a plurality of second balancing resistors that are respectively connected between the second electrodes of the even numbered cells and a plurality of second balancing terminals, and
wherein the balancing switch comprises a plurality of first balancing switches that are respectively connected between the first balancing terminals and the common terminals, and a plurality of second balancing switches that are respectively connected between the second balancing terminals and the common terminals.

12. The battery management system of claim 11, wherein the battery IC further comprises a plurality of first input terminals respectively connected to the first electrodes of the odd numbered cells, and a plurality of second input terminals respectively connected to the second electrodes of the even numbered cells,
wherein the voltage detection circuit comprises:
an analog-to-digital converter configured to convert voltages input through a first input and a second input thereof into digital data, and to output the digital data;
a plurality of first switches configured to respectively switch connections between the first input terminals and the first input of the analog-to-digital converter;
a plurality of second switches configured to respectively switch connections between the input terminals and the second input of the analog-to-digital converter;
a plurality of third switches configured to respectively switch connections between the first balancing terminals and the second input of the analog-to-digital converter; and
a plurality of fourth switches configured to respectively switch connections between the second balancing terminals and the first input of the analog-to-digital converter,
wherein the first switches and the third switches are controlled to connect the opposite ends of the first balancing resistors to the first and second inputs of the analog-to-digital converter when cell balancing is started, and
wherein the second switches and the fourth switches are controlled to connect the opposite ends of the second balancing resistors to the first and second inputs of the analog-to-digital converter when cell balancing is started.

13. The battery management system of claim 12, wherein the balancing control circuit comprises:
an integrator configured to acquire the voltage cumulative value from the digital data when cell balancing is started;
a comparator configured to output a result obtained by comparing the voltage cumulative value, and a target voltage cumulative value corresponding to the balancing target cell; and
a balancing switch control logic configured to control the balancing switch corresponding to the balancing target cell in response to an output of the comparator, and
wherein a voltage value output from the analog-to-digital converter during cell balancing corresponds to the voltage of the opposite ends of the respective balancing resistors.

14. The battery management system of claim 13, further comprising a battery controller configured to calculate a balancing factor of each of the cells from cell state information of each of the cells, and to calculate the target voltage cumulative value from the balancing factor.

15. The battery management system of claim 11, wherein the battery IC further comprises a plurality of input terminals respectively connected to the first electrodes of the cells,
wherein the voltage detection circuit comprises:
an analog-to-digital converter configured to convert voltages input through a first input and a second input thereof into digital data, and to output the digital data;
a plurality of first switches configured to respectively switch connections between the input terminals and the first input of the analog-to-digital converter; and a plurality of second switches configured to respectively switch connections between the input terminals and the second input of the analog-to-digital converter, and wherein the first switches and the second switches are controlled to sequentially connect the first and second electrodes of the cells to the first and second inputs of the analog-to-digital converter during cell voltage detection with respect to the cells.

16. The battery management system of claim 15, further comprising a plurality of filter resistors respectively connected between the first electrodes of the cells and the input terminals.

\* \* \* \* \*